US010533481B2

(12) United States Patent
Peck, Jr. et al.

(10) Patent No.: US 10,533,481 B2
(45) Date of Patent: Jan. 14, 2020

(54) THERMAL ELECTRIC ASSEMBLY ATTACHED ON AN OUTER SURFACE OF A HOT SECTION OF A GAS TURBINE ENGINE TO GENERATE ELECTRICAL POWER

(71) Applicant: The Boeing Company, Chicago, IL (US)

(72) Inventors: James L. Peck, Jr., Huntington Beach, CA (US); Jimmy M. Quiambao, Walnut, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/262,215

(22) Filed: Jan. 30, 2019

(65) Prior Publication Data
US 2019/0162100 A1    May 30, 2019

Related U.S. Application Data

(62) Division of application No. 14/952,166, filed on Nov. 25, 2015, now Pat. No. 10,208,641.

(51) Int. Cl.
*F01N 5/02* (2006.01)
*F04D 29/52* (2006.01)
(Continued)

(52) U.S. Cl.
CPC ............. *F01N 5/025* (2013.01); *B64D 27/10* (2013.01); *F02C 3/04* (2013.01); *F02C 7/00* (2013.01);
(Continued)

(58) Field of Classification Search
CPC . F01N 5/02; F01N 5/025; B64D 27/10; F02C 3/04; F02C 7/00; F02K 3/06;
(Continued)

(56) References Cited

U.S. PATENT DOCUMENTS

2009/0159110 A1   6/2009   Kwok et al.
2010/0193000 A1   8/2010   Prenninger et al.
(Continued)

FOREIGN PATENT DOCUMENTS

EP     2868896 A1    5/2015
WO     2015073101 A2  5/2015

OTHER PUBLICATIONS

Huang, James; "Aerospace and Aircraft Thermoelectric Applications," 2009, Retrieved from the Internet: https://www1.eere.energy.gov/vehiclesandfuels/pdfs/thermoelectrics_app_2009/thursday/huang.pdf, 14 pages.
(Continued)

*Primary Examiner* — Matthew T Martin
(74) *Attorney, Agent, or Firm* — Sage Patent Group

(57) ABSTRACT

A gas turbine engine assembly may include a combustion chamber for igniting a fuel and air mixture that generates a core stream flow. The gas turbine engine may also include a hot section cowling for directing the core stream flow through the engine assembly. The hot section cowling may include an inside surface and an outside surface opposite the inside surface. The gas turbine engine assembly may additionally include a plurality of thermoelectric generator (TEG) assemblies that are thermally attached to the outside surface of the hot section cowling. Each TEG assembly may include a multiplicity of thermoelectric generator (TEG) devices that generate an electric current based on a temperature differential across each of the multiplicity of TEG devices. The TEG devices may include different materials that are used in different heat zones along the hot section cowling between the combustion chamber and an exhaust end of the engine.

20 Claims, 7 Drawing Sheets

(51) Int. Cl.
*F23R 3/00* (2006.01)
*F02C 3/04* (2006.01)
*F02C 7/00* (2006.01)
*F02K 3/06* (2006.01)
*H01L 35/32* (2006.01)
*B64D 27/10* (2006.01)
*F04D 19/00* (2006.01)

(52) U.S. Cl.
CPC .............. *F02K 3/06* (2013.01); *F04D 19/002* (2013.01); *F04D 29/522* (2013.01); *F23R 3/002* (2013.01); *H01L 35/32* (2013.01); *F05D 2220/323* (2013.01); *F05D 2220/76* (2013.01); *F05D 2240/35* (2013.01); *Y02T 50/671* (2013.01)

(58) Field of Classification Search
CPC ..... F04D 19/002; F04D 29/522; H01L 31/00; H01L 31/30; H01L 31/32; H01L 31/34; F05D 2220/323; F05D 2220/76
See application file for complete search history.

(56) References Cited

U.S. PATENT DOCUMENTS

| | | |
|---|---|---|
| 2011/0108080 A1 | 5/2011 | Kwok et al. |
| 2012/0048321 A1 | 3/2012 | Danenberg et al. |
| 2012/0118345 A1 | 5/2012 | Stoia et al. |
| 2013/0205798 A1 | 8/2013 | Kwok et al. |

OTHER PUBLICATIONS

European Patent Office; Extended European Search Report for European Patent Application No. 16193047.4 dated Mar. 27, 2017, 8 pages.
Canadian Office Action dated Jul. 10, 2019 for Canadian Patent Application No. 2941821, 3 pages.

THERMAL ELECTRIC ASSEMBLY ATTACHED ON AN OUTER SURFACE OF A HOT SECTION OF A GAS TURBINE ENGINE TO GENERATE ELECTRICAL POWER

CROSS-REFERENCE TO RELATED APPLICATIONS

This application is a divisional of U.S. patent application Ser. No. 14/952,166, filed Nov. 25, 2015, now U.S. Pat. No. 10,208,641, issued Feb. 19, 2019, entitled "Thermal Electric Assembly Attached on an Outer Surface of a Hot Section of a Gas Turbine Engine to Generate Electrical Power," which is assigned to the same assignee as the present application and is incorporated herein in its entirety by reference.

FIELD

The present disclosure relates to generating electrical power, and more particularly to a thermal electric assembly attached on an outer surface of a hot section of a gas turbine engine to generate electrical power.

BACKGROUND

Airplanes typically require 28 volts direct current (VDC) for electrically powering airplane systems that require electrical power. Airplane jet engines or airplane gas turbine engines are required to provide this electrical power for electrical loads of the airplane, such as avionics systems, electromechanical systems, and other onboard systems that require electrical power. Electrical power onboard an airplane is typically supplied by a gear driven generator that is operatively coupled to a jet engine or gas turbine engine by a driveshaft and gears. The gears and generator remove thrust energy from the engine to produce the electrical power. Additionally, hydraulic and bleed air systems of the airplane also remove energy from the engine that could produce thrust. Accordingly, being able to eliminate the generator, drive shaft and gears could improve the efficiency of the engine, eliminate components that are subject to breakdown and require maintenance and reduce the weight of the airplane.

SUMMARY

In accordance with an embodiment, a gas turbine engine assembly may include a combustion chamber for igniting a fuel and air mixture that generates a core stream flow. The gas turbine engine may also include a hot section cowling for directing the core stream flow through the gas turbine engine assembly. The hot section cowling may include an inside surface that contains the core stream flow and an outside surface opposite the inside surface. The gas turbine engine assembly may further include a plurality of thermoelectric generator assemblies thermally attached to the outside surface of the hot section cowling. Each thermoelectric generator assembly may include a multiplicity of thermoelectric generator devices that generate an electric current based on a temperature differential across each of the multiplicity of thermoelectric generator devices. The thermoelectric generator devices may include different materials that are used in different heat zones along the hot section cowling between the combustion chamber and an exhaust end of the hot section cowling or exhaust end of the gas turbine engine.

In accordance with another embodiment, a thermoelectric generation system may include a gas turbine engine assembly. The gas turbine engine assembly may include a combustion chamber for igniting a fuel and air mixture that generates a core stream flow. The gas turbine engine assembly may also include a hot section cowling for directing the core stream flow through the gas turbine engine assembly. The hot section cowling may include an inside surface that contains the core stream flow and an outside surface opposite the inside surface. The thermoelectric generation system may also include a plurality of thermoelectric generator assemblies thermally attached to the outside surface of the hot section cowling. Each thermoelectric generator assembly may include a multiplicity of thermoelectric generator devices that generate an electric current based on a temperature differential across each of the plurality of thermoelectric generator devices. The thermoelectric generator devices may include different materials that are used in different heat zones along the hot section cowling between the combustion chamber and an exhaust end of the hot section cowling.

In accordance with a further embodiment, a method for generating electrical power may include distributing a plurality of thermoelectric generator assemblies along an outside surface of a hot section cowling of a gas turbine engine. The thermoelectric generator assemblies may each include a multiplicity of thermoelectric generator devices. The thermoelectric generator devices may include different materials used in different heat zones along the hot section cowling. The method may also include capturing waste heat from the hot section cowling of the gas turbine engine by the plurality of thermoelectric generator assemblies and converting the captured waste heat by the plurality of thermoelectric assemblies into electrical power.

In accordance with another embodiment or any of the previous embodiments, the plurality of thermoelectric generator assemblies may be distributed along the outside surface of the hot section cowling at predetermined locations between the combustion chamber and the exhaust end of the hot section cowling to maximize electrical power generation.

In accordance with another embodiment or any of the previous embodiments, the plurality of thermoelectric generator assemblies may include different types of thermoelectric generator devices. Each different type of thermoelectric generator device may include a particular group of materials configured to provide a highest efficiency of thermal energy to electrical energy conversion based on a temperature of the outside surface of the hot section cowling, during operation of the gas turbine engine, where each of the plurality of thermoelectric generator assemblies is located between the combustion chamber and the exhaust end of the hot section cowling.

In accordance with another embodiment or any of the previous embodiments, the thermoelectric generator assemblies may include different types of thermoelectric generator devices and are distributed along the outside surface of the hot section cowling between the combustion chamber and the exhaust end of the hot section cowling. The thermoelectric generator devices may be distributed based on an efficiency of each of the different types of thermoelectric generator devices in converting thermal energy to electrical energy according to a temperature of the outside surface of the hot section cowling at the predetermined location of each thermoelectric generator assembly.

In accordance with another embodiment or any of the previous embodiments, the gas turbine engine assembly may also include a fan at an inlet to the gas turbine engine assembly that generates a fan stream flow through the gas turbine engine assembly. The gas turbine engine assembly may additionally include a fan nozzle surrounding at least a portion of the hot section cowling. The fan nozzle directs the fan stream flow. The hot section cowling may be continuous from the combustion chamber to the exhaust end of the hot section cowling. The fan stream flow passes directly from the fan to the thermoelectric generator assemblies without being redirected.

In accordance with another embodiment or any of the previous embodiments, the gas turbine engine assembly may also include a power bus, a power management system and a power distribution system. The power bus provides the electrical power generated by the thermoelectric generator assemblies to the power management system and/or power distribution system. The power management system may be configured to deliver regulated power to electrically powered components and systems of a vehicle.

BRIEF DESCRIPTION OF THE DRAWINGS

The following detailed description of embodiments refers to the accompanying drawings, which illustrate specific embodiments of the disclosure. Other embodiments having different structures and operations do not depart from the scope of the present disclosure.

DETAILED DESCRIPTION

Figure 1:
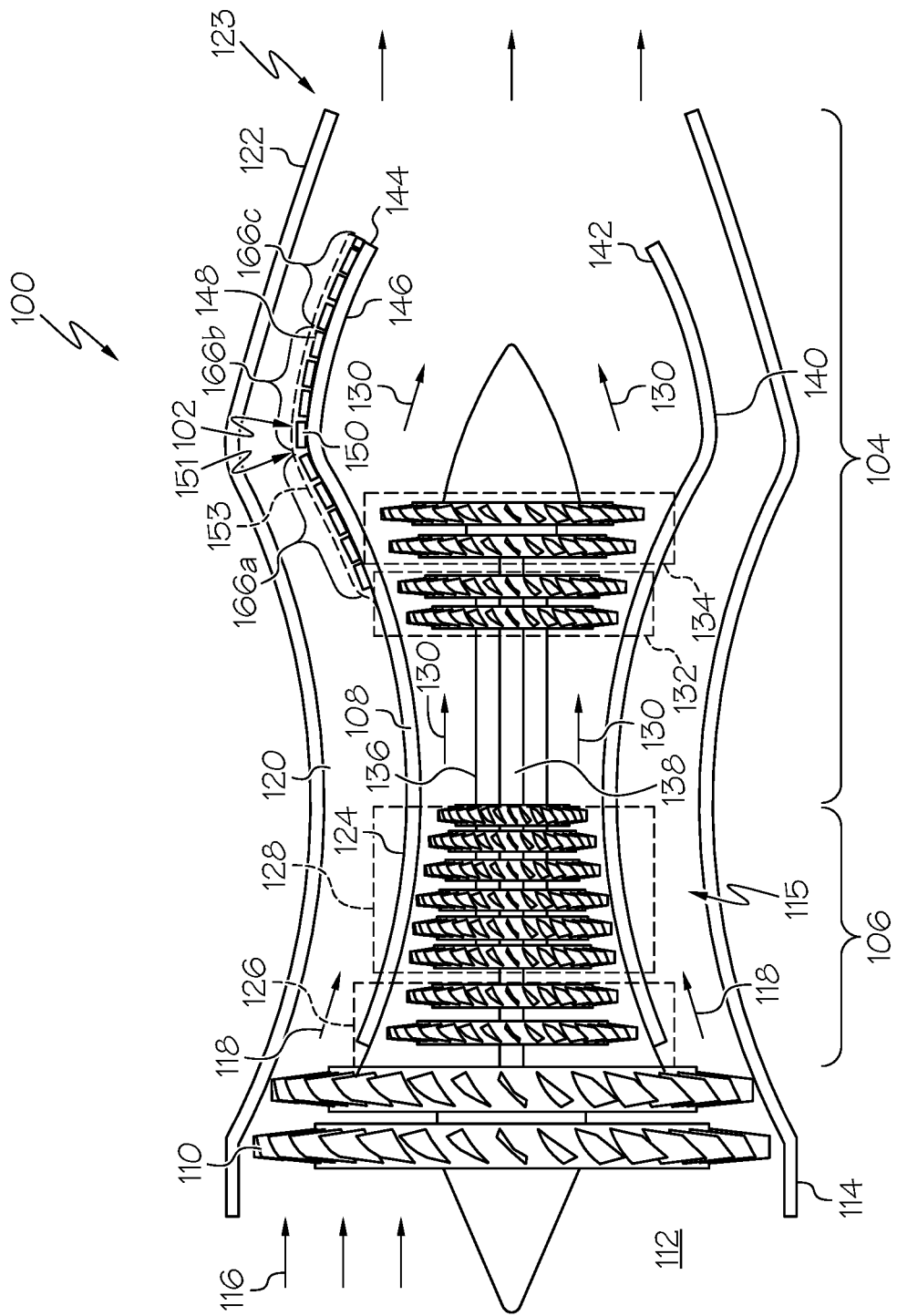
FIG. 1 is cross-sectional view of an example of a gas turbine engine including a thermoelectric generator assembly system installed on a hot section of the engine in accordance with an embodiment of the present disclosure.

The following detailed description of embodiments refers to the accompanying drawings, which illustrate specific embodiments of the disclosure. Other embodiments having different structures and operations do not depart from the scope of the present disclosure Like reference numerals may refer to the same element or component in the different drawings.

Certain terminology is used herein for convenience only and is not to be taken as a limitation on the embodiments described. For example, words such as "proximal", "distal", "top", "bottom", "upper," "lower," "left," "right," "horizontal," "vertical," "upward," and "downward", etc., merely describe the configuration shown in the figures or relative positions used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 is cross-sectional view of an example of a gas turbine engine assembly 100 including a thermoelectric generator assembly system 102 installed on a hot section 104 of the gas turbine engine assembly 100 in accordance with an embodiment of the present disclosure. The gas turbine engine assembly 100 may be considered to have at least two sections, a cold section 106 and a hot section 104. The cold section 104 may include that portion of the gas turbine engine assembly 100 before a combustion chamber 108. The hot section 104 may include the combustion chamber 108 and that portion of the gas turbine engine assembly 100 aft of the combustion chamber 108. A gas turbine engine or gas turbine engine assembly 100 may include different configurations. The configuration of the exemplary gas turbine engine assembly 100 is an example of a two-spool, low-bypass turbofan engine. Examples of other configurations of a gas turbine engine may include a high-bypass turbofan engine and a turbojet engine such as that shown in FIG. 2. The thermoelectric generator assembly system 102 described herein may be applicable to any configuration or type of gas turbine engine assembly and any application. Examples of applications of gas turbine engines may include but is not necessarily limited to propulsion of aircraft and other vehicles, such as watercraft or ships and land craft, and power generation. The components and operation of the exemplary gas turbine engine assembly 100 will be described briefly herein for understanding of the disclosure; however, the disclosure is not intended to be limited by the exemplary configuration described and other configuration may be equally applicable.

The gas turbine engine assembly 100 may include a fan 110 proximate to an inlet 112 or intake formed by a nacelle 114 of the gas turbine engine assembly 100. The nacelle 114 may completely surround a core 115 or both cold and hot sections 106 and 104 of the gas turbine engine assembly 100 as shown in the exemplary gas turbine engine assembly 100 in FIG. 1. In other embodiments, the nacelle 114 may only surround a portion of the core 115 of the gas turbine engine assembly 100 or partially extend over the hot section 104 of the gas turbine engine assembly 100.

An ambient air stream illustrated by arrows 116 may enter the gas turbine engine assembly 100 through the inlet 112 and is rapidly accelerated by the fan 110. A portion of the ambient air stream 116 accelerated by the fan 110 forms a fan stream flow illustrated by arrows 118 that is forced through a bypass air channel 120 or duct to a fan nozzle 122 at an aft end or exhaust end 123 of the gas turbine engine 100. The bypass air channel 120 may be formed between the nacelle 114 or an outer cowling of the gas turbine engine assembly 100 and an inner wall or inner cowling 124 of the gas turbine engine assembly 100.

Another portion of the ambient air stream 116 accelerated by the fan 110 flows through the core 115 of the gas turbine engine assembly 100 which includes a low pressure compressor 126 and a high pressure compressor 128 in the cold section 106. The low pressure compressor 126 and the high pressure compressor 128 further accelerate the ambient air stream 116 and generate a high pressure air stream that enters the combustion chamber 108. The low pressure compressor 126 and the high pressure compressor 128 may each include a series of circular disks or rotors. Each disk or rotor may include a multiplicity of compressor blades mounted around the circumference of each disk or rotor. The successive rotating disks or rotors in the series progressively accelerate the air stream passing through the low pressure compressor 126 and high pressure compressor 128 to the combustion chamber 108.

A fuel and air mixture under high pressure is ignited in the combustion chamber 108 and generates a core stream flow illustrated by arrows 130. The highly accelerated core stream flow 130 flows through a high pressure turbine 132 followed by a low pressure turbine 134 forcing the high pressure turbine 132 and the low pressure turbine 134 to rotate. The high pressure turbine 132 and the low pressure turbine 134 may each include a series of circular disks or rotors and each disk or rotor may include a multiplicity of turbine blades mounted around the circumference of each disk or rotor that force the turbines 132 and 134 to rotate when impacted by the high velocity core stream flow 130.

The high pressure turbine 132 is operatively coupled to the high pressure compressor 128 by a high pressure shaft 136. Accordingly, the high pressure turbine 132 drives the high pressure compressor 128 by the high pressure shaft 136. The low pressure turbine 134 is operatively coupled to the low pressure compressor 126 by a low pressure shaft 138. Thus, the low pressure turbine 134 drives the low pressure compressor 126 by the low pressure shaft 138.

The inner wall 124 or cowling in the hot section 104 may be referred to as the hot section cowling 140. The hot section cowling 140 may extend between at least proximate an aft or exhaust end of the combustion chamber 108 or high pressure turbine 132 to an exhaust end 142 of the hot section cowling 140 which in some configurations may also be the exhaust end of the gas turbine engine assembly 100. The exhaust end 142 of the hot section cowling 140 may also be referred to as a core nozzle. The hot section cowling 140 directs the core stream flow 130 through the gas turbine engine assembly 130. The hot section cowling 140 may include a wall 144. The wall 144 of the hot section cowling 140 may be continuous from the combustion chamber 108 to the exhaust end 142 of the hot section cowling 140 or core nozzle. The wall 144 of the hot section cowling 140 may include an inside surface 146 that contains the core stream flow 130 and an outside surface 148 opposite the inside surface 146 or exterior surface of the wall 144.

The thermoelectric generator assembly system 102 may include a plurality of thermoelectric generator assemblies 150. The plurality of thermoelectric generator assemblies 150 may be thermally attached to the outside surface 148 of the hot section cowling 140 or exterior surface of the wall 144. The thermoelectric generator assemblies 150 may be thermally attached to the outside surface 148 of the hot section cowling 140 at predetermined locations substantially completely around the hot section cowling 140 or partially around the hot section cowling 140 depending upon the amount of electrical power that is desired to be generated and the quantity of thermoelectric generator assemblies 150 that may be required to generate the desired amount of electrical power. Any interstices or gaps between the thermoelectric generator assemblies 150 may be filled with a heat resistant material 151 to provide a smooth surface between and over the thermoelectric generator assemblies 150 for the fan stream flow 118 to flow without any surface irregularities that may disrupt the fan stream flow 118 and cause any possible loss of efficiency of the gas turbine engine 100. In another embodiment, the thermoelectric generator assemblies 150 may be covered by a surface material 153, as illustrated by the broken line in FIG. 1, that is heat resistant and provides a smooth continuous surface for the fan stream flow 118 to pass over the thermoelectric generator assemblies 150 without disruption and loss of engine efficiency. The surface material 153 provides sufficient heat transfer or heat flow for efficient generation of electrical power by the thermoelectric generator assemblies 150.

Figure 3:
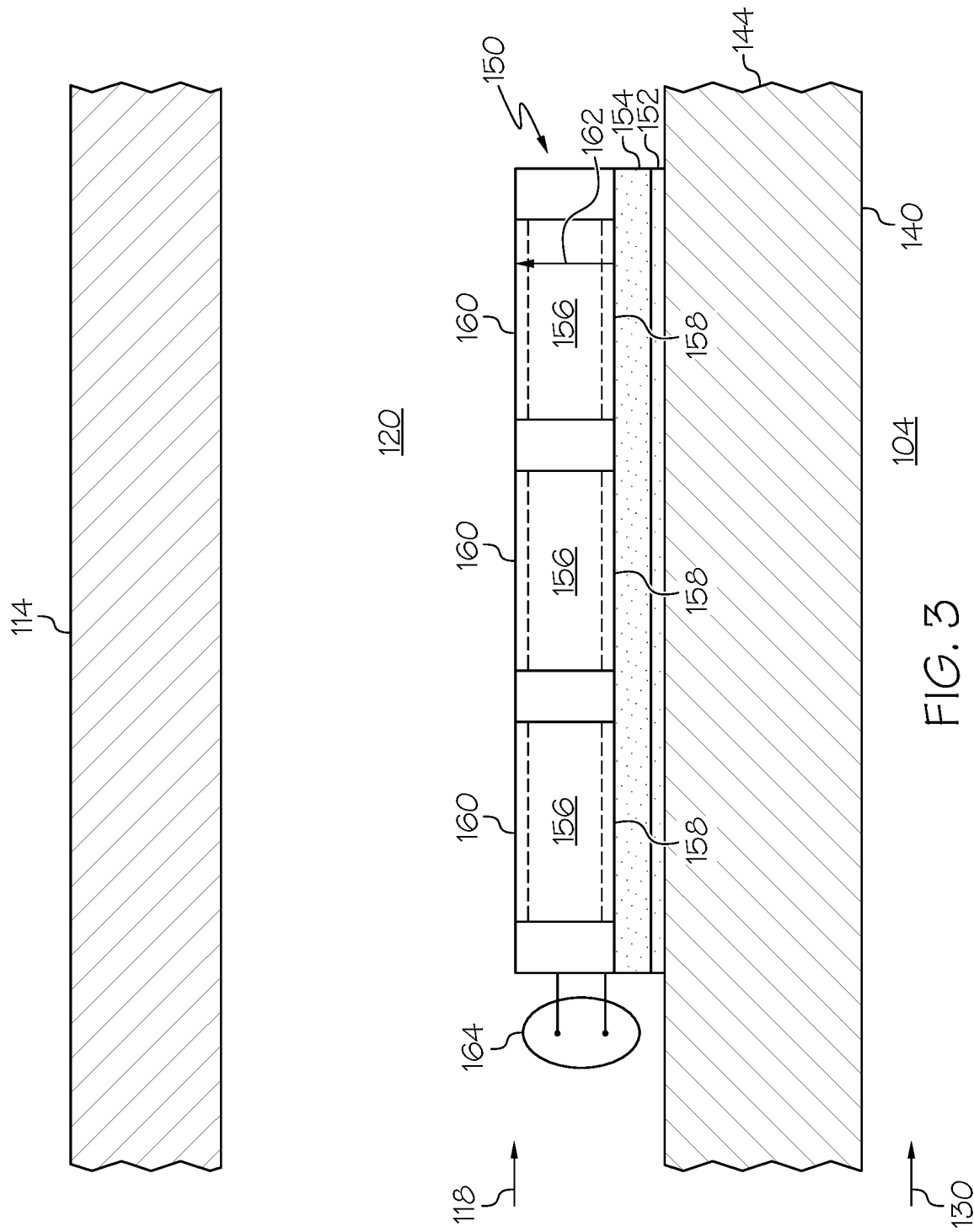
FIG. 3 is a detailed block schematic diagram of a thermoelectric generator assembly installed on an outside surface of a hot section of a gas turbine engine in accordance with an embodiment of the present disclosure.

Referring also to FIG. 3, FIG. 3 is a detailed block schematic diagram of an example of a thermoelectric generator assembly 150 installed on an outside surface 148 of a hot section 104 of a gas turbine engine 100 in accordance with an embodiment of the present disclosure. The nacelle 114 as best shown in FIG. 1 surrounds at least a portion of the hot section cowling 140 and directs the fan stream flow to pass over the thermoelectric generator assemblies 150. The hot section cowling 140 may be continuous from the combustion chamber 108 to the exhaust end 112 or core nozzle without any plenums or other airstream diverting arrangements. Accordingly, the fan stream flow 118 may pass directly from the fan 110 to the thermoelectric generator assemblies 150 without being redirected or diverted into any plenums or ducts.

The thermoelectric generator assembly 150 may be bonded to the outside surface 148 by a suitable thermally conductive bonding agent 152 or adhesive capable of withstanding the high temperatures on the outside surface 148 of the hot section cowling 140. At some locations along the hot section cowling 140 where the temperature of the outside surface 148 may exceed limits of the thermoelectric generator assembly 150 and cause damage to the thermoelectric generator assembly 150, a layer 154 of buffering material 154 in addition to the bonding agent 152, or the buffering material 154 in place of the bonding agent 152 or buffering material 154 added to the bonding agent 152 may be used to protect the thermoelectric generator assembly 150 from damage due to the high temperature or heat. For example, thermoelectric generator assemblies 150 located closer to the combustion chamber 108 (FIG. 1) where the temperature of the outside surface 148 may be highest, the buffering material 154 may be required or other material or arrangement to reduce the heat transferred from the outside surface 148 to a hot side 156 of the thermoelectric generator assembly 150.

Each thermoelectric generator assembly 150 may include a multiplicity of thermoelectric generators (TEG) or TEG devices 156 that generate an electric current based on a temperature differential across each of the multiplicity of TEG devices 156. A TEG or TEG device 156 can generate electricity when a temperature differential is applied or exists across the device. The TEG device 156 may typically be square or rectangular shaped with an upper and lower end-cap having the same dimension. Typically power generated by TEGs is transmitted via a set of power wires or terminals 164 or a power bus similar to that described herein with reference to FIG. 6. TEG devices 156 are typically thin (e.g., on the order of a couple of millimeters thick), small (e.g., a couple of square centimeters), flat, and brittle.

Accordingly, TEG devices can be difficult to handle individually, especially for applications in gas turbine engines as described herein and vehicles, such as automobiles, aircraft, and the like, where the TEG devices 156 can be subject to harsh environmental conditions, such as vibration, constant temperature variations and other harsh conditions. Because of their size and the fact that each TEG device 156 generates only a small amount of power, many TEG devices 156 are bundled together in order to generate a useful amount of power. Further, TEG devices 156 generally provide greater energy conversion efficiency at high temperature. This can cause relatively large thermal expansion in materials. Because of thermal gradients and different thermal coefficients of expansion associated with different materials, thermally induced stresses may result. Efficiency of TEG devices 156 generally increases with greater temperature differentials, i.e., delta temperature between two opposite sides, typically called the heat source or hot side 158 and heat sink or cold side 160 of the TEG device 156. Also, energy conversion efficiency is maximized for any installation that channels heat flow through the TEG devices 156 only without any thermal energy leaks through the surrounding structural material or gaps. Thus, to simplify handling and achieve high performance in converting heat to electricity, multiple TEG devices 156 can be encased into a module or assembly 150 prior to final installation.

As shown in FIG. 3, the hot side 158 of each TEG device 156 in the thermoelectric generator assembly 150 may be thermally coupled to the outside surface 148 of hot section cowling 140 by at least the thermally conductive bonding agent 152, and in areas of the hot section cowling 140 that experience temperature extremes that could damage the thermoelectric generator assembly 150, the layer of buffer material 154 may be disposed between the hot side 158 of the TEG devices 156 and the outer surface 148. The cold side 160 of each TEG device 156 is exposed to the fan stream flow 118 for creating the temperature differential across each TEG device 156 of the thermoelectric generator assembly 150. The flow of heat, as represented by arrow 162, through the thermoelectric generator device 156 due to the difference in temperatures ΔT between the hot side 158 and the cold side 160 causes a voltage ΔV to be generated across electrical terminals 164 of each thermoelectric generator device 156. The voltage generated by each TEG device 156 may be proportion to the temperature differential or heat flow 162 across the TEG device 156 of the thermoelectric generator assembly 150 or temperature difference between the hot side 158 and cold side 160 of each TEG device 156.

The temperature of a hot section 104 of a gas turbine engine 100 may vary between about 1200 degrees centigrade (C) and about 600 degrees C. There are available TEG devices that may operate at temperatures exceeding about 1000 degrees C. As shown in the figures and described herein, the hot section 104 of the engine 100 is cooled by ambient temperature or the fan stream flow 118. About a 100 degree C. to about a 300 degree C. differential across the TEG device 156 or transition between the hot side 158 and the cold side 160 yields the best results or performance in converting heat energy to electrical energy. Current TEG devices 156 may convert about 5% to about 8% of the thermal energy to electrical energy.

As previously described, the temperature of the outside surface 148 may vary along the hot section cowling 140. The thermoelectric generator devices 156 may include different materials that may be used in different heat zones 166a-166b (FIG. 1) along the hot section cowling 140 between the combustion chamber 108 and the exhaust end 142 of the hot section cowling 140 or core nozzle. For example, a temperature of the outside surface 148 of the hot section cowling 140 may be hottest at the exhaust of the combustion chamber 108 and the temperature of the outside surface 148 may gradually decrease along the hot section cowling 140 toward the exhaust end 142 or core nozzle.

Figure 4:
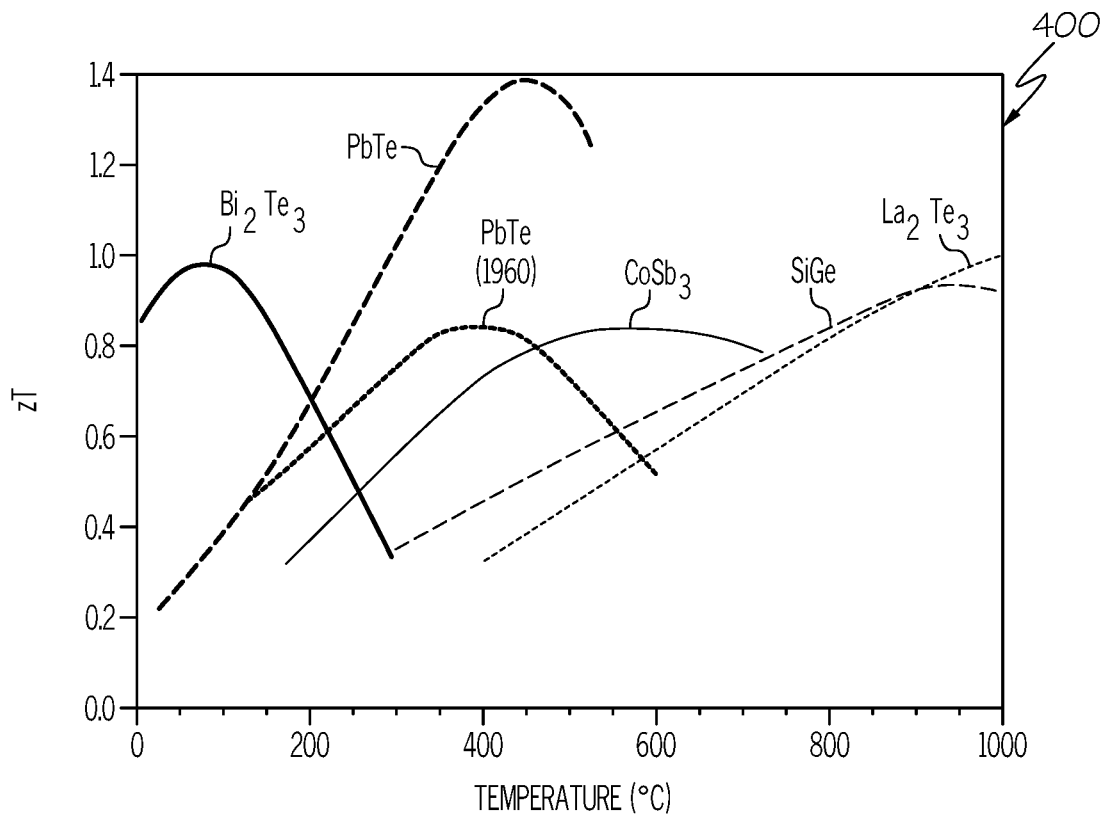
FIG. 4 is a graph illustrating an efficiency of different n-type thermoelectric generator materials at different temperatures in accordance with an embodiment of the present disclosure.
Figure 5:
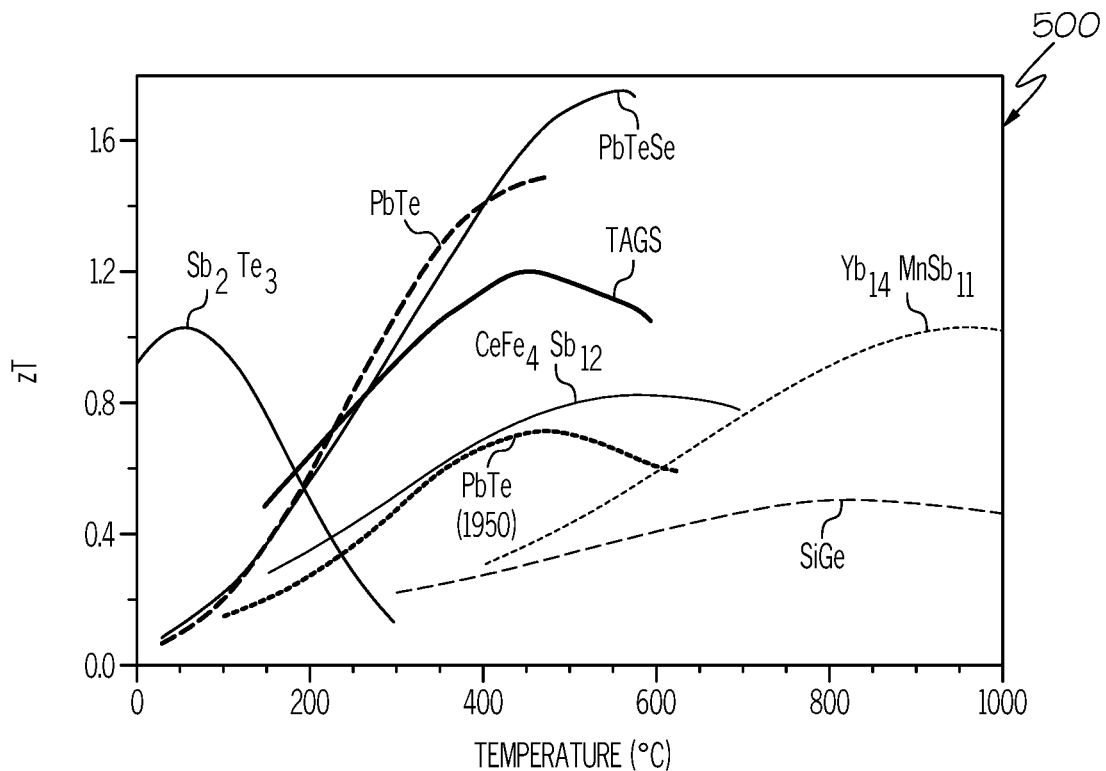
FIG. 5 is a graph illustrating an efficiency of different p-type thermoelectric generator materials at different temperatures in accordance with an embodiment of the present disclosure.

Referring also to FIG. 4 and FIG. 5, FIG. 4 is a graph 400 illustrating an efficiency of different n-type thermoelectric generator materials at different temperatures in accordance with an embodiment of the present disclosure. FIG. 5 is a graph 500 illustrating an efficiency of different p-type thermoelectric generator materials at different temperatures in accordance with an embodiment of the present disclosure. The graphs 400 and 500 show ZT for TEG devices composed of different materials over temperatures from 0 degrees C. to 1000 degrees C. ZT is a dimensionless figure of merit that corresponds to an ability of a given material or combination of materials to efficiently produce electric power. ZT may be defined by the following equation:

$$ZT = \frac{\sigma S^2 T}{\lambda}$$

Where S is the Seebeck coefficient, λ, is the thermal conductivity of the material or materials, σ is the electrical conductivity and T is the temperature. The higher ZT for a particular TEG device composed of a certain material or materials at a particular temperature or temperature range, the more efficient the TEG device composed of those materials is at generating electrical power at the particular temperature or temperature range. Accordingly, thermoelectric generator assemblies 150 including TEG devices that have a higher ZT or a higher efficiency of generating electrical power may be used at certain locations along the hot section cowling 140 based on a temperature of the outside surface 148 of the hot section cowling 140 during operation of the gas turbine engine.

In accordance with an embodiment, the plurality of thermoelectric generator assemblies 150 may be distributed along the outside surface 148 of the hot section cowling 140 at predetermined locations between the combustion chamber 108 and the exhaust end 142 of the hot section cowling 140 or core nozzle to maximize electrical power generation. The plurality of thermoelectric generator assemblies 150 may include different types of thermoelectric generator devices 156, each different type of thermoelectric generator device 156 may be formed from a particular material or particular group of materials configured to provide a highest efficiency of thermal energy to electrical energy conversion based on a temperature of the outside surface 148 of the hot section cowling 140, during operation of the gas turbine engine 100, where each of the plurality of thermoelectric generator assemblies 150 is located between the combustion chamber 108 and the exhaust end 142 of the hot section cowling 140 or core nozzle. Therefore, the different types of thermoelectric generator devices 156 may be configured to generate a predetermined level of electrical power based on a temperature of the outside surface 148 of the hot section cowling 140 at the predetermined location of the thermoelectric generator assembly 150 during operation of the gas turbine engine 100.

In another embodiment, the different types of thermoelectric generator devices 150 may be distributed along the outside surface 148 of the hot section cowling 140 between the combustion chamber 108 and the exhaust end 142 of the hot section cowling 140 or core nozzle based on an efficiency of each of the different types of thermoelectric generator devices 156 in converting thermal energy to electrical energy according to a temperature of the outside surface 148 of the hot section cowling 140 at the predetermined location of each thermoelectric generator assembly 150.

Figure 2:
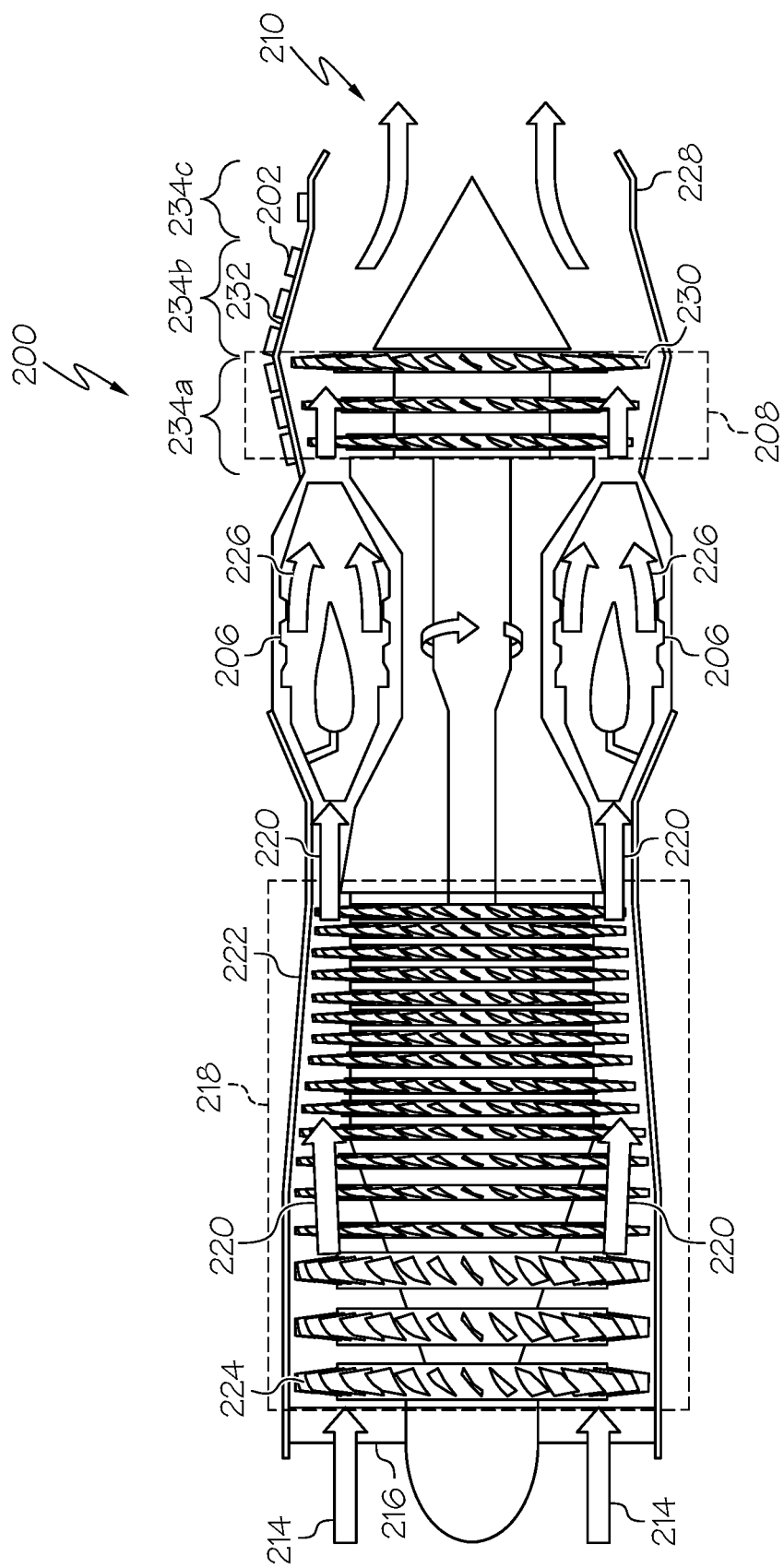
FIG. 2 is cross-sectional view of an example of a gas turbine engine including a thermoelectric generator assembly installed on a hot section of the engine in accordance with another embodiment of the present disclosure.

FIG. 2 is cross-sectional view of an example of a gas turbine engine 200 including a thermoelectric generator assembly 202 installed on a hot section 204 of the engine 200 in accordance with another embodiment of the present disclosure. The exemplary gas turbine engine 200 is configured as a turbojet engine. The hot section 204 of the gas turbine engine 200 may include a plurality of combustion chambers 206, a turbine 208 aft of the combustion chambers 206 and an exhaust end 210 of the gas turbine engine 200 or exhaust nozzle. The exemplary gas turbine engine 200 may include a cold section 212 forward of the a plurality of combustion chambers 206.

An ambient air stream represented by arrows 214 may enter an intake 216 or air inlet of the gas turbine engine 200. The ambient air stream 214 may be accelerated or compressed by a compressor 218 to generate a high speed compressed air stream flow represented by arrows 220. The compressor 218 may be surrounded by a nacelle 222 or cold section cowling for directing the compressed air stream flow 220 through the cold section 212. The compressor 218 may include a series of bladed rotors 224. Each bladed rotor 224 may include a multiplicity of blades circumferentially mounted around a perimeter of a circular disk or rotor. The compressed air stream flow 220 may be directed into the combustion chambers 206 by the nacelle 222. The compressed air stream flow 220 is mixed with fuel and ignited in the combustion chambers 206 to generate a core stream flow 226. The core stream flow 226 is directed from the combustion chambers 206 through the turbine 208. A hot section cowling 228 encloses the turbine 208 and may extend from at least the combustion chambers 206 to the exhaust end 210 of the gas turbine engine 200. The hot section cowling 228 directs the core stream flow 226 through the turbine 208 and out the exhaust end 210 of the gas turbine engine 200 at a high rate of speed for propulsion of an airplane to which the gas turbine engine 200 may be mounted. The turbine 208 may include a plurality of bladed rotors 230. Each bladed rotor 230 may include a multiplicity of turbine blades circumferentially mounted around a perimeter of a circular disk or rotor.

A plurality of thermoelectric generator assemblies 202 may be thermally attached to an outer surface 232 of the hot section cowling 228. The thermoelectric generator assemblies 202 may be similar to the thermoelectric generator assemblies 150 in FIG. 1. Similar to the thermoelectric generator assemblies 150 shown in FIG. 3, a hot side of the thermoelectric generator assemblies 202 may be thermally attached to the outer surface 232 of the hot section cowling 228 by a suitable thermally conductive bonding agent or adhesive capable of withstanding the high temperatures on the outer surface 232 of the hot section cowling 228. The bonding agent may be the same as bonding agent 152 in FIG. 3. At some locations along the hot section cowling 228 where the temperature of the outer surface 232 may exceed limits of the thermoelectric generator assembly 202 and cause damage to the thermoelectric generator assembly 202, a layer of buffering material in addition to the bonding agent, or the buffering material in place of the bonding agent, or buffering material added to the bonding agent 152 may be used to protect the thermoelectric generator assembly 202 from damage due to the high temperature or heat. The buffering material may be similar to the buffering material 154 in FIG. 3.

The temperature of the outer surface 232 may vary along the hot section cowling 228. The thermoelectric generator devices 202 may include different materials that may be used in different heat zones 234a-234c along the hot section cowling 140 between the combustion chambers 206 and the exhaust end 210 of the gas turbine engine 100. For example, a temperature of the outside surface 232 of the hot section cowling 228 may be hottest at the exhaust of the combustion chambers 206 and the temperature of the outside surface 232 may gradually decrease along the hot section cowling 228 toward the exhaust end 210. As previously described, thermoelectric generator assemblies 202 including different materials may be used at different locations or in different heat zones 234a-234c to provide the most efficient conversion of thermal energy to electrical energy along the hot section cowling 228.

Figure 6:
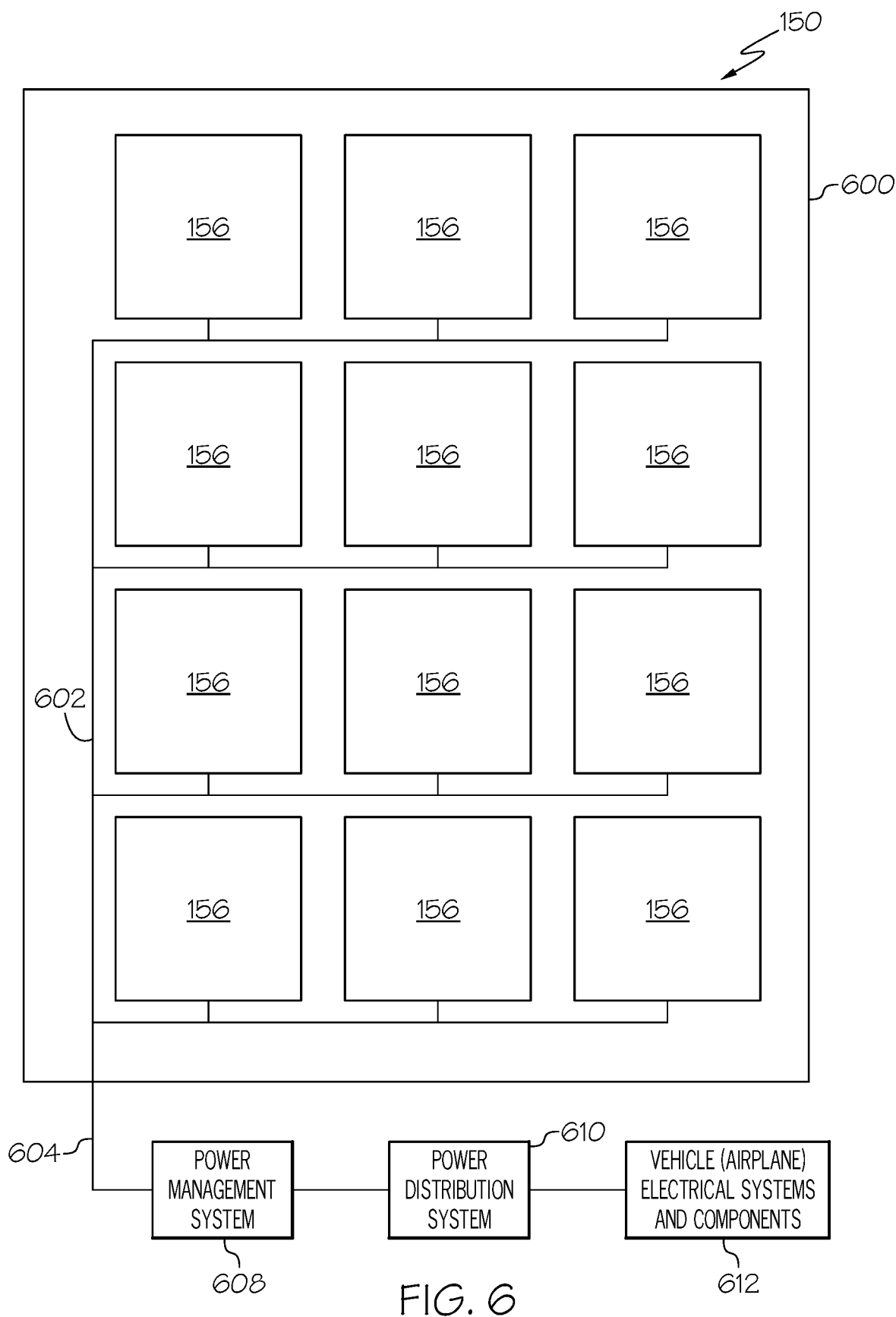
FIG. 6 is a detailed top view of a thermoelectric generator assembly of FIG. 1.

FIG. 6 is a detailed top view of a thermoelectric generator assembly 150 of FIG. 1. As previously described, the thermoelectric generator assemblies 202 in FIG. 2 may be the same or similar to the thermoelectric generator assemblies 150 in FIG. 1. Each thermoelectric generator assembly 150 may include a plurality of thermoelectric generator devices 156 similar to those described with reference to FIG. 3. The thermoelectric generator devices 156 may be mounted in a frame 600 and may be interconnected by electrically wiring 602. The electrical wiring 602 may connect each of the thermoelectric generator devices 156 of the thermoelectric generator assembly 150 to a power bus 604. The electrical power generated by each of the thermoelectric generator devices 156 may be provided to the power bus 604 by the electrical wiring 602. Each of the thermoelectric power assemblies 150 in FIG. 1 or thermoelectric power assemblies 202 in FIG. 2 may be connected by the power bus 604 to a power management system 608. Therefore, the electrical power generated by each of the thermoelectric power assemblies 150 or 202 is provided to the power management system 608 by the power bus 604. The power management system 608 may be a power management system of a vehicle, such as an airplane or other vehicle. The power management system 608 may be configured to convert and/or regulate the electrical power from the thermoelectric power assemblies 150 or 202 to electrical power that may be utilized by components or systems of the vehicle or airplane. Other examples of thermoelectric generator assemblies and systems that may be used for thermoelectric power assemblies 150 or 202 are described in U.S. Pat. No. 9,112,109, entitled "Thermoelectric Generator Assembly and System," issued Aug. 18, 2015, and assigned to the same assignee as the present application and is incorporated herein by reference.

The power management system 608 may be electrically connected to a power distribution system 610. The power distribution system 610 may be configured to provide regulated electrical power to the electrical systems and components of the vehicle or airplane. In accordance with some embodiments, the thermoelectric generator assemblies 150 in FIG. 1 or 202 in FIG. 2 may be configured as the only electrical power source for a vehicle. In other embodiments, the thermoelectric generator assemblies 150 or 202 may be configured as a primary electrical power source for a vehicle, and in further embodiments, the thermoelectric generator assemblies 150 and 202 may be configured as a secondary electrical power source for a vehicle.

Figure 7:
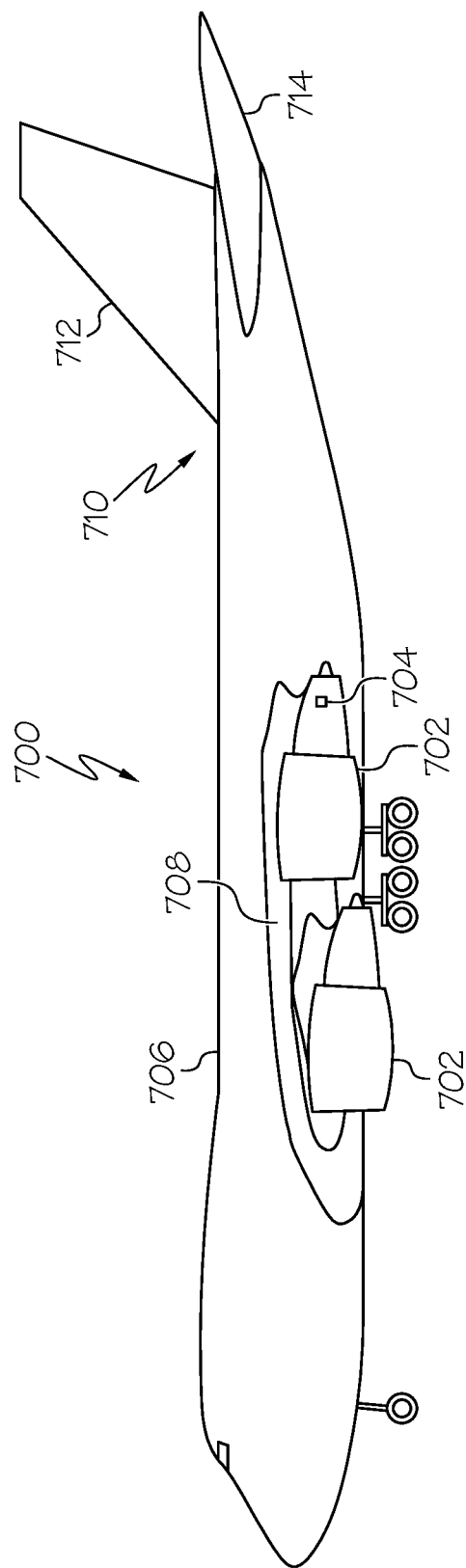
FIG. 7 is a schematic diagram of an example of an airplane including a plurality of gas turbine engines and a thermoelectric generator assembly system associated with at least one engine for generating electrical power in accordance with an embodiment of the present disclosure.

FIG. 7 is a schematic diagram of an example of an airplane 700 including a plurality of gas turbine engine assemblies 702 and a thermoelectric generator assembly system 704 associated with at least one gas turbine engine assembly 702 for generating electrical power in accordance with an embodiment of the present disclosure. The thermoelectric generator assembly system 704 may include a plurality of thermoelectric generator assemblies similar to thermoelectric generator assemblies 150 described herein. The airplane 700 may also include a fuselage 706 and a wing 708 extending from each side of the fuselage 706. In the exemplary airplane 700 illustrated in FIG. 7, the gas turbine engine assemblies 702 are mounted under the wings 708. In other embodiments, the gas turbine engine assemblies 702 may be associated with other components of the airplane 700, such as for example, the gas turbine engine assemblies may be mounted on the fuselage near a tail section 710 of the airplane 700. The tail section 710 of the airplane 700 may include a vertical stabilizer 712 or rudder and a horizontal stabilizer 714 or elevator.

Figure 8:
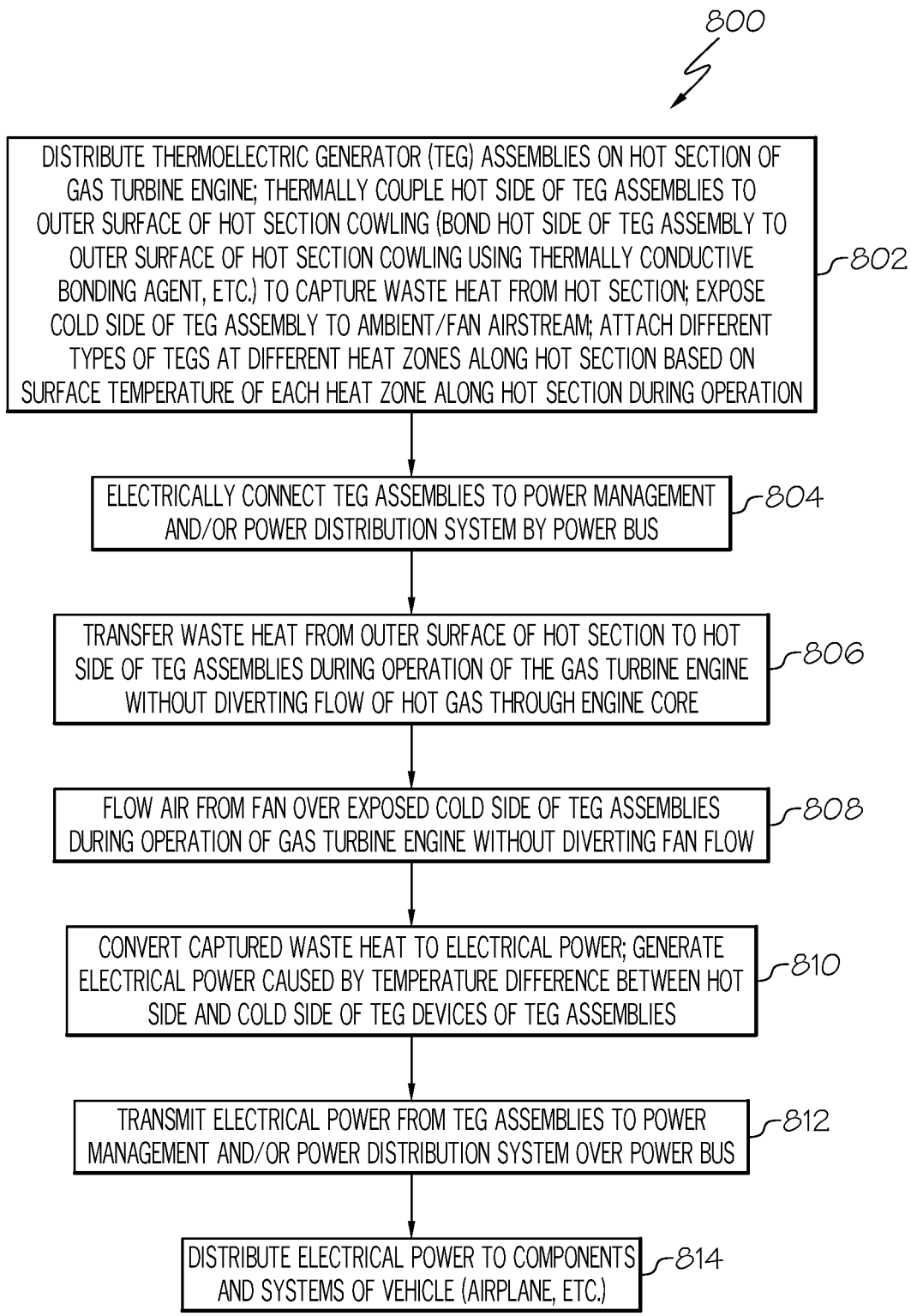
FIG. 8 is a flow chart of an example of a method for generating electrical power in accordance with an embodiment of the present disclosure.

FIG. 8 is a flow chart of an example of a method 800 for generating electrical power in accordance with an embodiment of the present disclosure. In block 802, a plurality of thermoelectric generator assemblies may be distributed along an outside surface of a hot section cowling of a gas turbine engine. The thermoelectric generator assemblies may each include a multiplicity of thermoelectric generator devices. A hot side of each thermoelectric generator assembly may be thermally coupled to the outer surface of the hot section cowling using a thermally conductive bonding agent, adhesive or similar material for thermally attaching the thermoelectric generator assemblies to the hot section cowling of the engine to capture waste heat from the hot section of the engine. A cold side of the thermoelectric generator assemblies may be exposed to ambient air or a fan stream air flow from a fan of the gas turbine engine. Different types of thermoelectric generator assemblies that include different types of thermoelectric generator devices may be used at different locations or distributed among different heat zones along the hot section cowling based on a surface temperature along the hot section cowling to provide a highest efficiency of conversion of thermal energy to electrical energy during operation of the gas turbine engine.

In block 804, each of the thermoelectric generator assemblies may be electrically connected to a power management system and/or to a power distribution system by a power bus. A power management system may be provided to convert and regulate electrical power generated by the thermoelectric generator assemblies to electrical power that is usable by systems and components of a vehicle associated with the gas turbine engine. The electrical power may be distributed to the systems and components of the vehicle by the power distribution system.

In block 806, heat may be transferred from the outside surface of a hot section of the gas turbine engine to a hot side of the thermoelectric generator devices of the thermoelectric generator assemblies during operation of the gas turbine engine. The heat may be transferred from the outside surface of the hot section to the hot side of the thermoelectric generator devices without diverting flow of hot gas through the engine core.

In block 808, cooling air from a fan of the gas turbine engine or a fan airstream or stream flow may flow over exposed cold sides of the thermoelectric generator devices of the thermoelectric generator assemblies during operation of the gas turbine engine. The cooling air may flow directly from the fan of the gas turbine engine to the cold side of the thermoelectric devices without diverting the fan stream flow.

In block 810, waste heat captured from the hot section of the gas turbine engine by the thermoelectric generator assemblies may be converted to electrical power by the thermoelectric generator assemblies. Electrical power may be generated by a temperature differential between the hot side and a cold side of thermoelectric generator devices of each of the thermoelectric generator assemblies as described herein.

In block 812, electrical power generated by the thermoelectric generator assemblies may be transmitted to a power management system and/or power distribution system by a power bus. In block 814, electrical power may be distributed to the components and systems of a vehicle by the power distribution system.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to embodiments of the invention in the form disclosed. Many modifications and variations will be apparent to those of ordinary skill in the art without departing from the scope and spirit of embodiments of the invention. The embodiment was chosen and described in order to best explain the principles of embodiments of the invention and the practical application, and to enable others of ordinary skill in the art to understand embodiments of the invention for various embodiments with various modifications as are suited to the particular use contemplated.

Although specific embodiments have been illustrated and described herein, those of ordinary skill in the art appreciate that any arrangement which is calculated to achieve the same purpose may be substituted for the specific embodiments shown and that embodiments of the invention have other applications in other environments. This application is intended to cover any adaptations or variations of the present invention. The following claims are in no way intended to limit the scope of embodiments of the invention to the specific embodiments described herein.

What is claimed is:

1. A method for generating electrical power, comprising:
distributing a plurality of thermoelectric generator assemblies along an outside surface of a hot section cowling of a gas turbine engine, the thermoelectric generator assemblies each comprising a multiplicity of thermoelectric generator devices, the thermoelectric generator devices comprising different materials used in different heat zones along the hot section cowling;
disposing a layer of buffer material between a hot side of the thermoelectric generator devices and the outside surface of the hot section cowling only in a heat zone closest a combustion chamber of the gas turbine engine; and
converting heat from the hot section cowling of the gas turbine engine into electrical power by the plurality of thermoelectric assemblies.

2. The method of claim 1, further comprising transferring heat from the hot section cowling of the gas turbine engine to a hot side of each of the thermoelectric generator devices during operation of the gas turbine engine.

3. The method of claim 2, further comprising flowing cooling air over a cold side of each of the thermoelectric generator devices during operation of the gas turbine engine to cause a temperature difference between the hot side and the cold side of each thermoelectric generator device, the temperature difference causing an electric current to be generated by each thermoelectric generator device.

4. The method of claim 3, wherein flowing cooling air over the cold side of each of the thermoelectric generator devices comprises flowing cooling air from a fan of the gas turbine engine over the cold side of each of the thermoelectric generator devices.

5. The method of claim 3, further comprising:
transmitting the electrical power to a power distribution system; and
distributing the electrical power to components and systems of a vehicle by the power distribution system.

6. The method of claim 1, wherein the hot section cowling comprises a wall, the wall of the hot section cowling being continuous from the combustion chamber to an exhaust end of the hot section cowling, and wherein distributing the plurality of thermoelectric generator assemblies comprises thermally attaching the thermoelectric generator assemblies to an exterior surface of the wall.

7. The method of claim 1, wherein the gas turbine engine comprises a fan nozzle surrounding at least a portion of the hot section cowling to direct a fan stream flow, wherein the method further comprises exposing the thermoelectric generator assemblies to the fan stream flow.

8. The method of claim 1, wherein the gas turbine engine comprises:
a fan at an inlet to the gas turbine engine that generates a fan stream flow through the gas turbine engine assembly; and
a fan nozzle surrounding at least a portion of the hot section cowling, wherein the fan nozzle directs the fan stream flow, and the hot section cowling of the gas turbine engine is continuous from the combustion chamber to an exhaust end of the hot section cowling, wherein the method further comprises passing the fan stream flow directly from the fan to the thermoelectric generator assemblies without being redirected.

9. The method of claim 1, wherein distributing the plurality of thermoelectric generator assemblies comprises distributing the plurality of thermoelectric generator assemblies along the outside surface of the hot section cowling at predetermined locations between the combustion chamber and an exhaust end of the hot section cowling to maximize electrical power generation.

10. The method of claim 1, wherein the plurality of thermoelectric generator assemblies includes different types of thermoelectric generator devices, each different type of thermoelectric generator device comprising a particular group of materials configured to provide a highest efficiency of thermal energy to electrical energy conversion based on a temperature of the outside surface of the hot section cowling, during operation of the gas turbine engine assembly, wherein each of the plurality of thermoelectric generator assemblies is located between the combustion chamber and an exhaust end of the hot section cowling.

11. The method of claim 1, wherein the plurality of thermoelectric generator assemblies comprises different types of thermoelectric generator devices, the method further comprising configuring the different types of thermoelectric generator devices to generate a predetermined level of electrical power based on a temperature of the outside surface of the hot section cowling at a predetermined location of the thermoelectric generator assembly during operation of the gas turbine engine.

12. The method of claim 1, wherein the thermoelectric generator assemblies comprise different types of thermoelectric generator devices and wherein distributing the plurality of thermoelectric generator assemblies comprises distributing the thermoelectric generator assemblies along the outside surface of the hot section cowling between the combustion chamber and an exhaust end of the hot section cowling based on an efficiency of each of the different types of thermoelectric generator devices in converting thermal energy to electrical energy according to a temperature of the outside surface of the hot section cowling at a predetermined location of each thermoelectric generator assembly during operation of the gas turbine engine.

13. The method of claim 1, further comprising:
electrically connecting the plurality of thermoelectric generator assemblies to a power bus; and
electrically connecting the power bus to a power management system, wherein the power bus provides electrical power generated by the thermoelectric generator assemblies to the power management system, the power management system being configured to deliver regulated power to electrically powered components and systems of a vehicle.

14. The method of claim 13, wherein the vehicle comprises an airplane.

15. The method of claim 1, further comprising configuring the gas turbine engine for propulsion of an airplane.

16. The method of claim 1, further comprising configuring the thermoelectric generator assemblies as a secondary electrical power source for a vehicle.

17. The method of claim 1, further comprising configuring the thermoelectric generator assemblies as a primary electrical power source for a vehicle.

18. The method of claim 1, wherein thermoelectric generator devices comprise different n-type thermoelectric generator materials and different p-type thermoelectric generator materials used in different heat zones that have different outside surface temperatures along the hot section cowling between the combustion chamber and an exhaust end of the hot section cowling, the method further comprising distributing the plurality of thermoelectric generator assemblies based on an efficiency of each of the different types of thermoelectric generator devices in converting thermal energy to electrical energy according to a temperature of the outside surface of the hot section cowling at a particular location of each thermoelectric generator assembly during operation of the gas turbine engine.

19. A method for generating electrical power, comprising:
thermally attaching a plurality of thermoelectric generator assemblies along an outside surface of a hot section cowling of a gas turbine engine, the thermoelectric generator assemblies each comprising a multiplicity of thermoelectric generator devices, the thermoelectric generator devices comprising different materials used in different heat zones along the hot section cowling;
disposing a layer of buffer material between a hot side of the thermoelectric generator devices and the outside surface of the hot section cowling only in a heat zone closest a combustion chamber of the gas turbine engine; and
converting heat from the hot section cowling of the gas turbine engine into electrical power by the plurality of thermoelectric assemblies.

20. The method of claim 19, further comprising distributing the plurality of thermoelectric generator assemblies along the outside surface of the hot section cowling at predetermined locations between the combustion chamber and an exhaust end of the hot section cowling to maximize electrical power generation.

* * * * *